(12) United States Patent
Kojima et al.

(10) Patent No.: US 6,331,376 B1
(45) Date of Patent: Dec. 18, 2001

(54) ORGANIC-SOLVENT-BASED PHOTOCURABLE RESIST COMPOSITION AND RESIST PATTERN-FORMING METHOD

(75) Inventors: Daisuke Kojima; Genji Imai; Jun Akui; Hideo Kogure; Osamu Isozaki, all of Kanagawa-ken (JP)

(73) Assignee: Kansai Paint Co., Ltd., Hyogo-ken (JP)

( * ) Notice: Subject to any disclaimer, the term of this patent is extended or adjusted under 35 U.S.C. 154(b) by 0 days.

(21) Appl. No.: 09/582,846

(22) PCT Filed: Nov. 2, 1999

(86) PCT No.: PCT/JP99/06115

§ 371 Date: Jul. 5, 2000

§ 102(e) Date: Jul. 5, 2000

(87) PCT Pub. No.: WO00/26724

PCT Pub. Date: May 11, 2000

(30) Foreign Application Priority Data

Nov. 4, 1998 (JP) .................................................. 10-312752

(51) Int. Cl.$^7$ ................................. G03F 7/029; G03F 7/30
(52) U.S. Cl. .................................. 430/284.1; 430/288.1; 430/325; 522/29
(58) Field of Search ................................ 430/284.1, 325, 430/288.1; 522/29

(56) References Cited

U.S. PATENT DOCUMENTS

| | | | |
|---|---|---|---|
| 4,153,778 | * 5/1979 | Park et al. | 528/76 |
| 4,877,711 | 10/1989 | Aoai et al. | 430/284.1 |
| 5,290,663 | * 3/1994 | Huynh-Tran | 430/284.1 |
| 5,415,972 | 5/1995 | Mayes | 430/284.1 |

FOREIGN PATENT DOCUMENTS

| | | |
|---|---|---|
| 0 152 377 | 8/1985 | (EP) . |
| 63-221110 | 9/1988 | (JP) . |
| 02-155957-A | * 6/1990 | (JP) . |
| 2-232217 | 9/1990 | (JP) . |
| 3-4225 | 1/1991 | (JP) . |
| 3-223759 | 10/1991 | (JP) . |
| 5-241338 | 9/1993 | (JP) . |
| 6-136077 | 5/1994 | (JP) . |
| 6-321895 | 11/1994 | (JP) . |
| 7-5685 | 1/1995 | (JP) . |
| 7-102037 | 4/1995 | (JP) . |
| 7-225474 | 8/1995 | (JP) . |

* cited by examiner

Primary Examiner—John S. Chu
(74) Attorney, Agent, or Firm—Fisher, Christian & Sabol

(57) ABSTRACT

An organic solvent based photocurable resist composition containing a photopolymerizable polyurethane compound having a repeating unit represented by the following formula: B—[X]$_n$[Y]$_m$—B, where X is represented by the formula:

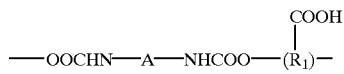

and Y is represented by the formula: —OOCHN—A—NHCOO(R$_2$)—, A is a structural unit derived from a polyisocyanate compound, B is same or different and a structural unit derived from a hydroxy compound having at least one photopolymerizable unsaturated group at molecular terminals respectively and optionally containing an ether linkage, R$_1$ is a structural unit derived from a carboxyl group-containing polyol compound, R$_2$ is a structural unit derived from a polyol compound, n is an integer of 1 to 10, m is an integer of 1 to 10, provided that one X and one Y are bonded to each other, or three or more of X and/or Y are bonded to each other.

7 Claims, No Drawings

ORGANIC-SOLVENT-BASED PHOTOCURABLE RESIST COMPOSITION AND RESIST PATTERN-FORMING METHOD

FIELD OF THE INVENTION

The present invention relates to an organic solvent based photocurable resist composition, and particularly an organic solvent based photocurable resist composition for use in the preparation of a printed circuit board. The organic solvent based photocurable resist composition is applicable to a solder resist, etching resist, anti-plating resist and the like.

BACKGROUND ART

A method of forming a conductor circuit such as a printed circuit board is known in the art, which comprises coating a photocurable resist composition onto a board, followed by exposing to light, developing to form a resist pattern, and by etching to remove unnecessary portion.

For example, a photocurable resist composition capable of being developed with a weak alkali by use of an unsaturated resin having carboxyl group is known as the above photocurable resist composition (see Japanese Patent Application Laid-Open No. 223759/91).

The above carboxyl group-containing unsaturated resin is usually prepared as described in the above prior art by a process which comprises subjecting an acid unsaturated monomer such as acrylic acid with alkyl (meth)acrylate monomer to a radical copolymerization reaction to obtain a polycarboxylic acid resin, followed by subjecting the resin and an epoxy group-containing unsaturated monomer such as glycidyl (meth)acrylate to an addition reaction of a part of the carboxyl group-containing alkyl (meth)acrylate monomer with glycidyl group.

The use of the above acid resin as an alkali development type resist composition had such problems (1) that a broad molecular weight distribution of the acid resin prepared by the radical polymerization reaction causes a reduction of solubility due to an alkali developing solution or etching solution in a high molecular weight region and an increase of solubility due to the alkali developing solution or etching solution in a low molecular weight region, resulting in making it impossible to carry out a uniform developing treatment or etching treatment, (2) that difference of a radical copolymerization reaction speed between a (meth)acrylic acid monomer component and alkyl (meth)acrylate monomer may produce a homopolymer of the acrylic acid monomer or an acrylic resin containing the acrylic acid component in a small amount, resulting in that formation of a fine resist pattern is made impossible due to non-uniform speed of removing the resist film by the alkali developing treatment, remaining of the resist film in a short period of treating time, and to erosion and washing out of a photocured film, (3) that heating on the addition reaction between the polycarboxylic acid resin and the epoxy group-containing unsaturated monomer further increases molecular weight of the polycarboxylic acid resin, (4) that unnecessary presence with the resin of a radical polymerization inhibitor usually added for the purpose of inhibiting the radical polymerization reaction unsaturated groups on the addition reaction reduces reactivity of the photopolymerization reaction, and (5) that erosion and washing out of the photocured film by the etching solution due to unsatisfactory properties of the photocured film makes it impossible to form a fine resist pattern.

As a method of introducing an unsaturated group into the resin, in addition to the above method, for example, Japanese Patent Application Laid-Open No. 102037/95 discloses a process for preparing a water-soluble actinic radiation-curable resin which comprises reacting a polyhydroxy compound, radically polymerizable unsaturated group-containing polyhydroxy compound, anionic hydrophilic group-containing polyhydroxy compound, polyisocyanate compound and radically polymerizable unsaturated group-containing monohydroxy compound to obtain a polyurethane resin, followed by neutralizing with an amine. However, use of the above water-soluble polyurethane resin as a resist composition produced such problems that poor alkali developing properties and anti-etching properties make it impossible to form a fine resist pattern.

As another method of introducing an unsaturated group into the resin, Japanese Patent Application Laid-Open No. 136077/94 discloses a radiation-curable resin composition prepared by reacting a reaction product of dimethylol propionic acid with ε-caprolactone, organic polyisocyanate compound and hydroxyl group-containing (meth)acrylate. However, use of the above resin composition as the resist composition had problems of poor properties in alkali developing properties, anti-ethcing properties and the like.

DESCLOSURE OF THE INVENTION

The present inventors made intensive studies to solve the above problems to find out that a specified organic solvent based photocurable resist composition shows good properties in an alkali developing properties, anti-etching resist properties, etc., and has such a good performances as to form a fine resist pattern, resulting in completing the present invention.

That is, the present invention provides an organic solvent based photocurable resist composition containing a photopolymerizable polyurethane compound having a repeating unit represented by the following formula; B—[X]$_n$[Y]$_m$—B$_1$, where X is represented by the formula:

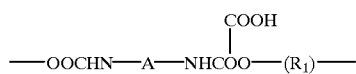

and Y is represented by the formula: —OOCHN—A—NHCOO—(R$_2$)—, A is a structural unit derived from a polyisocyanate compound, B is same or different and a structural unit derived from a hydroxy compound having at least one photopolymerizable unsaturated group at molecular terminals respectively and optionally containing an ether linkage, R$_1$ is a structural unit derived from a carboxyl group-containing polyol compound, R$_2$ is a structural unit derived from a polyol compound, n is an integer of 1 to 10, m is an integer of 1 to 10, provided that one X and one Y are bonded to each other, or three or more of X and/or Y are bonded to each other.

Preferable Embodiment of the Invention

The organic solvent based photocurable resist composition of the present invention is explained hereinafter. Respective compounds, from which respective structural units in the above formulas are formed, are a polyisocyanate compound, hydroxy compound having at least one photopolymerizable unsaturated group at molecular terminals, carboxyl group-containing polyol compound and polyol compound respectively. These compounds are explained hereinafter.

The polyisocyanate compound is used for bonding a compound introducing carboxyl group into the molecule to a compound introducing photopolymerizable unsaturated group at molecular terminals.

The polyisocyanate compound may include aliphatic diisocyanate compound such as hexamethylene diisocyanate, trimethylenediisocyanate, 1,4-tetramethylenediisocyanate, pentamethylenediisocyanate, 1,2-propylenediisocyanate, 1,2-butylenediisocyanate, trimethylhexamethylene diisocyanate, dimer acid diisocyanate, lysinediisocyanate, 2,3-butylenediisocyanate, 1,3-butylenediisocyanate and the like; alicyclic diisocyanate compound such as isophoronediisocyanate, 4, 4'-methylene bis (cyclohexylisocyante), methylcyclohexane-2,4-(or -2,6-) diisocyanate, 1,3-(or 1,4-)-di(isocyanatomethyl) cyclohexane, 1,4-cyclohexanediisocyanate, 1,3-cyclopentanediisocyanate, 1,2-cyclohexanediisocyanate and the like; aromatic diisocyanate compound such as xylyenediisocyanate, m-xylylene diisocyanate, tetramethylxylyenediisocyanate, tolylenediisocyanate, 4,4'-diphenyl-methanediisocyanate, 1,5-naphthalenediisocyanate, 1,4-naphthalenediisocyanate, 4,4'-toluidinediisocyanate, 4,4'-diphenyletherdiisocyanate, (m- or p-) phenylenediisocyanate, 4,4'-biphenylenediisocyanate, 3,3'-dimethyl-4,4'-biphenylenediisocyanate, bis(4-isocyanatophenyl) sulfone, isopropylidene bis(4-phenylisocyanate) and the like; other polyisocyanates, for example, polyisocyanate compounds having three or more isocyanate group such as triphenylmethane -4,4',4"-triisocyanate, 1,3,5-triisocyanatobenzene, 2,4,6-triisocyanatotoluene, 4,4'-dimethyidiphenylmethane -2,2',5, 5'-tetraisocyanate and the like, adducts prepared by reacting a polyol such as ethylene glycol, propylene glycol, 1,4-butylene glycol, polyalkylene glycol, trimethylolpropane, hexanetriol and the like with a polyisocyanate compound in an excess amount of isocyanate group relative to hydroxy group in the polyol, biuret type adducts of hexamethylenediisocyanate, isophoronediisocyanate, tolylenediisocyanate, xylenediisocyanate, 4,4'-diphenylmethanediisocyanate, 4,4'-methylene bis (cyclohexylisocyanate) and the like, isocyanuric ring type adducts, and the like. These compounds may be used alone or in combination. Of these, aromatic diisocyanate compounds are preferable, because the aromatic diisocyanate compound is hardly hydrolyzed to the alkali developing solution and is capable of forming a photocured film, which has high resistance to the alkali developing solution and etching solution, and which is so tough as to be sufficiently adhered without being separated from the substrate by an external force such as the etching solution and the like until the photocured resist film is removed from the resist pattern forming method.

The hydroxy compound having at least one photopolymerizable unsaturated group at molecular terminals is a compound used for introducing the photopolymerizable unsaturated group to the molecular terminals.

The photopolymerizable unsaturated group is an unsaturated group which is subjected to a radical polymerization reaction by light to form a crosslinked structure and may include unsaturated groups known in the art. Of these, (meth)acryloyl group is particularly preferable.

The hydroxy compound may include ones prepared by reacting one mole of polyhydric alcohol with one mole or more of an unsaturated acid so that hydroxyl group may remain after reaction. Specific examples thereof may include hydroxy compounds containing respectively one unsaturated group in one molecule of hydroxyethyl (meth)acrylate, hydroxypropyl (meth)acrylate, hydroxymethyl (meth) acrylate, (poly)ethylene glycol mono(meth)acrylate, (poly) propylene glycol mono(meth)acrylate, 1,6-hexanediol mono (meth)acrylate and the like; hydroxy compounds containing respectively two or more unsaturated groups in one molecule of glycerine di(meth)acrylate, diglycerine di(meth) acrylate, diglycerine tri(meth)acrylate, trimethylolpropane (meth)acrylate, pentaerythritol (meth)acrylate, pentaerythritol tri(meth)acrylate, dipentaerythritol di(meth)acrylate, hydroxyisocyanurate di(meth)acrylate, sorbitol di(meth) acrylate and the like; and the like. These may be used alone or in combination. Of these, the hydroxy compounds containing two or more of unsaturated group are preferable.

The carboxyl group-containing polyol compound is such that introduction of carboxyl group into the molecule makes it possible to remove a non-irradiated resist film by the alkali developing treatment.

The carboxyl group-containing polyol compound may include compounds containing at least one carboxyl group and two or more hydroxy groups in the molecule. Specific examples thereof may include, for example, semiester compounds prepared by reacting 2,2-dimethylol propionic acid, 2,2-dimethylol acetic acid, 2,2-dimethylol pentanic acid, or triol compounds with an acid anhydride; sulfonate diol compounds prepared by subjecting sodium dimethylsulfoisophthalate and glycols to ester exchange reaction in the presence of an excess amount of the glycols; and the like. These may be used alone or in combination.

In the above formulas representing the photopolymerizable polyurethane compound, n is in the range of 1 to 10, preferably 1 to 5. When n is less than 1, the alkali developing treatment is made impossible. When n is more than 10, a resist sensitivity and the like may be reduced. Usually, the photopolymerizable polyurethane compound has a number average molecular weight in the range of about 1000 to 20000.

The polyol compound is such that a hydrophobic group free of carboxyl group in the molecule is introduced into a molecular backbone so as to control a balance between hydrophilic properties and hydrophobic properties in the polyurethane compound. On the other hand, polyalkylene glycol having a number average molecular weight in the range of about 500 to 5000 or the like per se provides hydrophilic properties, and is also capable of imparting flexibility to the resist film, resulting in improving film performances in alkali developing properties, anti-etching properties, etc.

The polyol compound may include compounds containing at least two hydroxy groups in the molecule. Specific examples thereof may include (poly)methylene glycol, (poly)ethylene glycol, (poly)propylene glycol, 1,4-butanediol, 1,3-butanediol, 2,3-butanediol, 1,2-butanediol, 3-methyl-1,2-butanediol, 1,2-pentanediol, 1,5-pentanediol, 1,4-pentanediol, 2,4-pentanediol, 2,3-dimethyltrimethylene glycol 3-methyl-3,4-pentanediol, 3-methyl-4,5-pentanediol, 2,2,4-trimethyl-1,3-pentanediol, 1,6-hexanediol, 1,5-hexanediol, 1,4-hexanediol, 2,5-hexanediol, 1,4-cyclohexanediol, neopentyl glycol, pentaerythritol, trimethylol propane, glycerol and the like. These may be used alone or in combination. Of these, the hydroxy compound containing two hydroxy groups in one molecule is preferable.

The photopolymerizable polyurethane compound may be prepared by the same process as in the general polyurethane resin. That is, the photopolymerizable polyurethane compound may be prepared by a process which comprises subjecting a mixture of a carboxyl group-containing polyol compound, polyol compound and polyisocyanate compound at such an excess amount of polyisocyanate group that an isocyanate group to hydroxy group molar ratio is in the range of about 2.0 to 1.1, preferably about 2.0 to 1.2, to addition reaction between isocyanate group and hydroxy group to prepare a carboxyl group-containing isocyanate compound, followed by subjecting a mixture of the carboxyl group-containing isocyanate compound with a photopolymerizable unsaturated group-containing polyol compound at such a mixing ratio that an isocyanate group to hydroxy group molar ratio is in the range of about 0.8 to 1.0, preferably about 0.9 to 1.0, to addition reaction. Otherwise, the carboxyl group may be esterified with lower alcohol such as methanol, ethanol, propanol and the like to be blocked prior to the above addition reaction, followed by heating after reaction to remove the lower alcohol for regenerating the carboxyl group.

The addition reaction between isocyanate group and hydroxy group may be carried out at a reaction temperature usually in the range of 50 to 150° C., but preferably 1000° C. or lower so as to prevent polymerization of radically polymerizable unsaturated group. If needed, an urethane-forming reaction catalyst may be used. The urethane-forming reaction catalyst may include organotin compounds such as tin octylate, dibutyltin dilaurate and the like. In the preparation of the polyurethane resin, an organic solvent may optionally be used. Examples of the organic solvent may include acetone, methyl ethyl ketone, methyl isobutyl ketone, ethyl acetate, butyl acetate, toluene, xylene, N,N-dimethylformamide, N-methyl-2-pyrrolidone and the like.

The light defined in the present invention may include actinic radiation such as electron rays, ultraviolet light, visible light and the like. In the case where crosslinking is carried out by irradiation of ultraviolet light or visible light, a radical photopolymerization initiator and optionally a photosensitizer may also be added.

The radical photopolymerization initiator may include ones known in the art, for example, aromatic carbonyl compounds such as benzophenone, benzoin methyl ether, benzoin isopropyl ether, benzylxanthone, thioxanthone, anthraquinone and the like; acetophenones such as acetophenone, propiophenone, α-hydroxyisobutylphenone, α,α'-dichloro-4-phenoxyacetophenone, 1-hydroxy-1-cyclohexylacetophenone, diacetylphenone, and the like; organic peroxides such as benzoyl peroxide, t-butylperoxy-2-ethylhexanoate, t-butylhydroperoxide, di-t-butyl-diperoxyisophtharate, 3,3',4,4'-tetra (t-butylperoxycarbonyl) benzophene and the like; diphenyl halonium salts such as diphenyliodonium bromide, diphenyliodonium chloride and the like; organohalides such as carbon tetrabromide, chloroform, iodoform and the like; heterocyclic and polycyclic compounds such as 3-phenyl-5-isooxazolone, 2,4,6-tris(trichloromethyl)-1,3,5-triazine benzanthrone and the like; azo compounds such as 2,2'-azo (2,4-dimethylvaleronitrile), 2,2-azobisisobutylonitrile, 1,1'-azobis(cyclohexane-1-carbonitrile), 2,2'-azobis(2-methylbutylonitrile) and the like; iron-allene complex (see European Patent No. 152377), titanocene compounds (see Japanese Patent Application Laid-Open No. 221110/88), bisimidazole based compounds; N-arylglycidyl based compounds; acridine based compounds; combinations of aromatic ketone with aromatic amine; peroxyketal (see Japanese Patent Application Laid-Open No. 321895/94) and the like. Of the above radical photopolymerization initiators, di-t-butyidiperoxyisophthalate, 3,3'4,4'-tetra (t-butylperoxycarbonyl) benzophenone, iron-allene complex and titanocene compound are preferable because of high activity on crosslinking or polymerization.

Trade names of the radical photopolymerization initiator may include Irgacure 651 (marketed by Ciba Geigy Limited, trade name, acetophenone based radical photopolymerization initiator), Irgacure 184 (marketed by Ciba Geigy Limited, trade name, acetophenone based radical photopolymerization initiator), Irgacure 1850 (marketed by Ciba Geigy Limited, trade name, acetophenone based radical photopolymerization initiator), Irgacure 907 (marketed by Ciba Geigy Limited, trade name, aminoalkylphenone based radical photopolymerization initiator), Irgacure 369 (marketed by Ciba Geigy Limited, trade name, aminoalkylphenone based radical photopolymerization initiator), Lucirin TPO (marketed by BASF Ltd., trade name, 2,4,6-trimethylbenzoyl diphenylphosphine oxide), Kayacure DETXS (marketed by Nippon Kayaku Co., Ltd., trade name), CGI-784 (marketed by Ciba Geigy Limited, trade name, titanium complex compound), and the like. These may be used alone or in combination.

Examples of photosensitive dyes may include ones based on thioxanthene, xanthene, ketone, thiopyrylium salt, base styryl, merocyanine, 3-substituted coumarine, 3,4-substituted coumarine, cyanine, acrydine, thiazine, phenothiazine, anthracene, coronene, benzanthracene, perylene, merocyanine, ketocoumarine, fumarine, borate, and the like. These may be used alone or in combination. The borate based photosensitive dyes may include ones disclosed in, for example, Japanese Patent Application Laid-Open Nos. 241338/93, 5685/95 and 225474/95.

The photopolymerizable composition of the present invention optionally contain other unsaturated compounds, adhesion promotors, polymerization inhibitors such as hydroquinone, 2,6-di-t-butyl-p-cresol, N,N-diphenyl-p-phenylene diamine and the like, organic resin fine particles of saturated resin, unsaturated group-containing vinyl polymer and the like, pigments such as color pigment, extender pigment and the like, metallic oxides such as cobalt oxide and the like, plasticizers such as dibutyl phthalate, dioctyl phthalate, tricresyl phosphate, polyethylene glycol, polypropylene glycol and the like, cissing inhibitor, flowability controlling agent, and the like.

The other unsaturated compound may include, for example, a compound having preferably 1 to 4 radically polymerizable unsaturated groups, and monomer, dimer, trimer and other oligomers which insolubilize an exposed area by addition polymerization on exposure. Specific examples of these compounds may include acrylic acid, methacrylic acid, ethylene glycol di(meth)acrylate, diethylene glycol di(meth)acrylate, triethylene glycol di(meth)acrylate, tetra or more (4–16) polyethylene glycol di(meth)acrylate, propylene glycol di(meth)acrylate, trimethylol propane tri(meth)acrylate, pentaerythritol tetra(meth) acrylate, ethylene glycol diitaconate, ethylene glycol dimaleate, hydroquinone di(meth)acrylate, resorcinol di(meth)acrylate, pyrogallol (meth)acrylate, oligourethane acrylate, oligoepoxy acrylate, divinyl benzene and the like. The above ethylenicaly unsaturated compounds may be used alone or in combination.

An amount of the ethylenically unsaturated compound is usually in the range of 200 parts by weight or less, preferably 3 to 50 parts by weight per 100 parts by weight of the photopolymerizable urethane compound.

The above adhesion promotor is used for improving adhesion of the coating film to the base board, and may include, for example, tetrazoles such as tetrazole, 1-phenyltetrazole, 5-aminotetrazole, 5-amino-1-methyltetrazole, 5-amino-2-phenyltetrazole, 5-mercapto-1-phenyltetrazole, 5-mercapto-1-methyltetrazole, 5-methylthiotetrazole, 5-chloro-1-phenyl-1H-tetrazole, and the like. These may be used alone or in combination.

The above saturated resin may be used for controlling solubility of the photocurable resist composition, that is, may be used as an inhibitor for solubility of the resist film in the alkali developing solution, or for solubility in a strong alkali solution, for example, used in removal of the photocured film. Examples thereof may include polyester resin, alkyd resin, (meth) acrylic resin, vinyl resin, epoxy resin, phenol resin, natural resin, synthetic rubber, silicone resin, fluorocarbon resin, polyurethane resin, and the like. These may be used alone or in combination.

The unsaturated resin may preferably include ones having about 1 to 10 on an average, particularly about 1 to 4 unsaturated groups in one molecule of the above resin.

An amount to be used of the saturated or unsaturated resin is generally in the range of 200 parts by weight or less, preferably 3 to 50 parts by weight per 100 parts by weight of the photopolymerizable polyurethane compound.

The photocurable resist composition of the present invention is applicable to wide uses, as photocurable materials known in the art, for example, coating composition, ink, adhesive, resist material, printing materials such as photoengraving material for use in lithography or letterpress printing, PS plate for use in offset printing, information recording material, relief image-forming material and the like, particularly as the resist composition.

The photocurable resist composition may be used as an organic solvent based resist, as it is, and may be coated onto a base film to be used in a dry film resist.

The organic solvent based resist may be prepared by dissolving or dispersing the photocurable resist composition into an organic solvent such as ketones, esters, ethers, cellosolves, aromatic hydrocarbons, alcohols, halogenated hydrocarbons and the like.

The above composition may be coated onto a substrate, for example, a sheet of metals such as aluminum, magnesium, copper, zinc, chrome, nickel, iron and the like or of alloys comprising the above metals, a printed circuit board surface-treated with the above metals, plastic, glass, silicone wafer, carbon, etc. by a coating method such as roller, roll coater, spin coater, curtain roll coater, spray, electrostatic coating, dip coating, silk screen printing and the like, followed by optional setting, and drying to obtain a photocurable resist film.

The surface of the photocurable resist film may be covered with a cover coat layer prior to being exposed to light for curing. The above cover coat layer may be used as a barrier to oxygen in air so that deactivation by oxygen of radicals generated on exposure to light may be controlled, resulting in smoothly proceeding curing of photocurable materials by exposure to light.

The cover coat layer may be formed by covering the surface of a coating film with a resin film having a film thickness of about 1 (one) to 70 $\mu$m and formed from polyester resin such as polyethylene terephothalate and the like, acrylic resin, polyethylene, polyvinyl chloride resin and the like, or by coating to be a dry film thickness of about 0.5 to 5 $\mu$m onto the surface of a coating film an aqueous solution prepared by dissolving or dispersing into water aqueous resins from polyvinyl alcohol, partially saponified product of polyvinyl acetate, polyvinyl alcohol-vinyl acetate copolymer, partially saponified polyvinyl acetate-vinyl acetate copolymer, polyvinyl pyrrolidone, water-soluble polysuccharides polymers such as plurane and the like, respectively basic group, acid group or salt-containing acrylic resin, polyester resin, vinyl resin, epoxy resin and the like, followed by drying. The cover coat layer may preferably be removed after exposure of the surface of the photocurable material to light and prior to the developing treatment. The cover coat layer of the water-soluble polysaccharides polymer or the aqueous resin may be removed with a solvent capable of dissolving or dispersing the above resins, for example, water, aqueous acid solution, aqueous basic solution and the like.

The dry film resist is prepared by a process which comprises coating the organic solvent based resist composition onto a transparent resin film constituting a base film layer and formed from polyester resin such as polyethylene terephthalate and the like, acrylic resin, polyethylene, polyvinyl chloride resin and the like by use of a roll coater, blade coater, curtain flow coater and the like, followed by drying to form a photocurable resist film having a dry film thickness of 0.5 to 50 $\mu$m, particularly 1 to 15 $\mu$m, and applying a protective film onto the surface of the photocurable resist film.

The dry film resist may be used for forming a photocurable resist film onto the above-mentioned substrate by removing the protective film, followed by adhering the photocurable resist film to the above substrate so that the photocurable resist film may face to the substrate by a thermocompression bonding method and the like. The resulting photocurable resist film is then exposed to light and cured depending on a predetermined printed image after removing or without removing the base film layer, followed by subjecting to a developing treatment directly or after removing the base coat layer as the case may be to form the printed image. In the dry film resist, optionally the above-mentioned cover coat layer may be applied between the base film layer and the photocurable resist film. The cover coat layer either may be coated or adhered onto the photocurable resist film. The cover coat layer either may be removed or may not be removed prior to the developing treatment.

A light source to be used in photocuring may include, for example, respectively ultrahigh pressure, high pressure, moderate pressure, low pressure mercury lamps, chemical lamp, carbon arc lamp, xenone lamp, metal halide lamp, tungsten lamp and the like, and various lasers having an oscillating curve in a visible light region. Of these, argon laser having an oscillating curve in 488 nm and YAG-SHG laser having an oscillating curve in 532 nm are preferable.

The photocurable resist composition of the present invention may be coated or printed onto a substrate, for example, a plastic sheet, metal, glass, paper wood and the like. The above composition may preferably be used for forming a resist pattern film.

The method of forming the resist pattern onto the substrate by use of the above photocurable resist composition is explained hereinafter.

The resist pattern may be formed by a method which comprises (1) coating the organic solvent based photocurable resist composition onto a substrate to form a photocurable resist film, (2) exposing the photocurable resist film directly to a laser beam or through a negative mask to light for curing so that a resist film having a predetermined printed image can be obtained, and (3) subjecting the photocurable resist film to an alkali developing treatment, and removing a non-cured area of the phoptocurable resist film with an aqueous alkali solution to form a resist pattern on the substrate. Thereafter, a copper layer not covered with the resist film may removed by etching, followed by removing the resist film to obtain a conductor pattern.

Examples of the substrate may include electrical insulating plastic film or plastic plate such as glass-epoxy resin plate, polyethylene terephthalate film, polyimide film and the like; ones prepared by forming an electrically conductive film, for example, by adhering a metal foil of copper, aluminum and the like, or by subjecting metals such as copper, nickel, silver and the like or compounds such as electrically conductive oxides such as indium tin oxide (ITO) and the like to vacuum metallizing, chemical metallizing, plating and the like onto the surface of the above plastic plate or plastic film; cones prepared by forming an electrically conductive film on the surface of a plastic plate or plastic film having a through hole or on the through hole; metal plate such as copper plate and the like, and the like.

In the coating step (1), the photocurable resist composition is coated onto the surface of the substrate by a coating method such as spray coating, electrostatic coating, spin coating, dip coating, roller coating, curtain flow coating, silk screen printing and the like, followed by optionally setting, and by drying at a temperature in the range of about 50 to 130° C. to form a photocurable resist film. The resulting photocurable resist film is exposed to light in the following step (2), in which a non-photocurable cover coat known in the art may optionally be applied onto the surface of the photocurable resist film as a barrier to oxygen for preventing inhibition of curing of the photocurable resist film by exposure to light.

The light source used in the above step (2) of exposing to light may preferably include visible light practically used and having a wave length in an emission spectrum of the light of 488 nm as an argon laser or 532 nm as a YAG-SHG laser without being limited thereto.

The washing out of the non-cured resist film in the step (3) of the developing treatment may be carried out by use of an aqueous weak alkali solution prepared by diluting caustic soda, sodium carbonate, caustic potash, ammonia, amine and the like with water. In the case where the cover coat is used, the cover coat may preferably be removed prior to the developing treatment.

In the case where the resist pattern is used as an etching resist base, an exposed and non-circuit copper layer in the resist pattern may be removed by etching by use of an aqueous solution of ferric chloride or cupric chloride. Removal of the resist film may be carried out by use of a strong alkali such as caustic soda and the like or a solvent such as methyl chloride and the like.

The base having the resist pattern may be used as decoration, solder resist base and etching resist base.

EXAMPLE

The present invention is explained more in detail by the following Examples, in which "part" and "%" represent "part by weight" and "% by weight" respectively.

Preparation of Photocurable Resist Composition

Example 1

Photopolymerizable polyurethane

| | |
|---|---|
| Compound A (*) | 100 parts |
| Polymerization initiator (**) | 3 parts |
| Photosensitizer (***) | 1.5 parts |
| Ethyl acetate | 400 parts |

The above formulation was mixed to prepane a photocurable resist composition of Example 1.

(*) photopolymerizable polyurethane compound A: an addition product of a reaction product of one mole of dimethylol butyric acid, one mole of polyethylene glycol having a number average molecular weight of 2000 and 3 moles of xylylene diisocyanate with 2 moles of trimethylolpropane diacrylate as represented by the following formula:

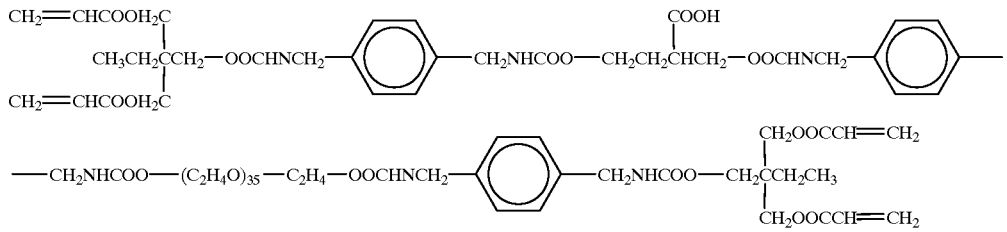

(**) Polymerization initiator: titanocene compound, trade name, CGI-784, marketed by Ciba Geigy Limited.
(***) Photosensitizer LS-1: coumarin based photosensitizer, trade name, NKX-1595, Nippon Kankoshikiso Co., Ltd.

The photocurable composition obtained as above was coated by a bar coater onto a copper-clad glass fiber-reinforced epoxy resin base having a copper layer of 18 μm on its surface, a base thickness of 2 mm and a size of 350×460 mm, followed by drying at 60° C. for 10 minutes to obtain a photocurable resist film having a dry film thickness of 10 μm.

A visible light laser was irradiated onto the photocurable resist film-formed epoxy resin base so as to result a resolution of 100 μm/100 μm [Line (μm)/space (μm)] in an irradiation dose of 5 mj/cm$^2$ by use of a 488 nm wave length argon ion laser irradiation apparatus, followed by heating the photocurable resist-formed epoxy resin base at 60° C. for 10 minutes, dipping into a 1% sodium carbonate aqueous solution at 30° C. for one minute to carry out an alkali developing treatment for removing the non-cured area of the photocurable resist film, resulting in forming a resist pattern having a good resolution of 100 μm/100 μm, carrying out etching by dipping into an aqueous 24% ferrice chloride solution at 20° C. for 2 minutes to remove an exposed copper layer, resulting in obtaining a good resolution of 100 μm/100 μm.

Example 2

Example 1 was duplicated except that the following photopolymerizable polyurethane compound (B) (*) was used in place of the photopolymerizable polyurethane compound A in Example 1 to prepare a photocurable composition of Example 2 as represented by the following formula:

(*) Photopolymerizable polyurethane compound B: an adduct of a reaction product of one mole of dimethylol butyric acid, one mole of propylene glycol (number average molecular weight: 1000) and 3 moles of xylylene disocyanate with 2 moles of trimethylolpropane diacrylate. The photocurable composition of Example 2 was subjected to the same procedures as in Example 1 to form a photocurable resist film on the epoxy resin base.

A visible light laser was irradiated onto the photocurable resist film-formed epoxy resin base so as to result a resolution of 100 μm/100 μm [line (μm)/space (μm)] in an irradiation dose of 5 mj/cm$^2$ by use of a 488 nm wave length argon ion laser irradiation apparatus, followed by heating the photocurable resist-formed epoxy resin base at 60° C. for 10 minutes, dipping into a 1% sodium carbonate aqueous solution at 30° C. for one minute to carry out an alkali developing treatment for removing the non-cured area of the photocurable resist film, resulting in forming a resist pattern having a good resolution of 100 μm/100 μm, carrying out etching by dipping into an aqueous 24% ferric chloride solution for 2 minutes to remove an exposed copper layer, resulting in obtaining a good resolution of 100 μm/100 μm.

Example 3

Example 1 was duplicated except that the following photopolymerizable polyurethane compound (C)(*) was used in place of the photopolymerizable polyurethane compound A in Example 1 to prepare a photocurable composition of Example 3 as represented by the following formula:

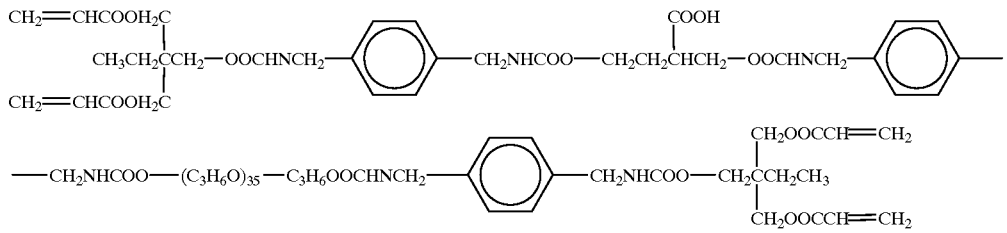

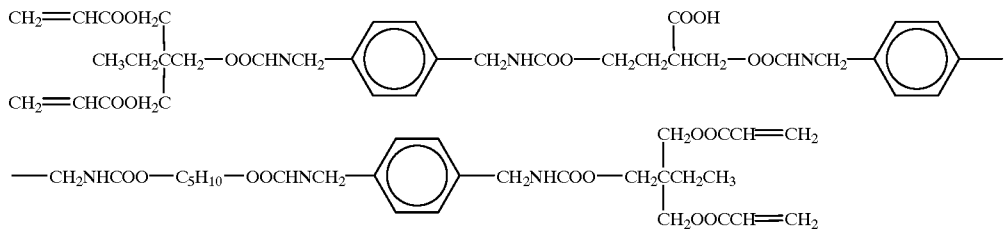

(*) Photopolymerizable polyurethane compound C: an adduct of a reaction product of one mole of dimethylol butyric acid, one mole of 1,5-pentanediol and 3 moles of xylylene diisocyanate with 2 moles of trimethylolpropane diacrylate.

The photocurable composition of Example 3 was subjected to the same procedures as in Example 1 to form a photocurable resist film on the epoxy resin base.

A visible light laser was irradiated onto the photocurable resist film-formed epoxy resin base so as to result a resolution of 100 μm/100 μm [line (μm)/space (μm)] in an irradiation dose of 5 mj/cm$^2$ by use of a 488 nm wave length argon ion laser irradiation apparatus, followed by heating the photocurable resist-formed epoxy resin base at 60° C. for 10 minutes, dipping into a 1% sodium carbonate aqueous solution at 30° C. for one minute to carry out an alkali developing treatment for removing the non-cured area of the photocurable resist film, resulting in forming a resist pattern having a good resolution of 100 μm/100 μm, carrying out etching by dipping into an aqueous 24% ferric chloride solution at 20° C. for 2 minutes to remove an exposed copper layer, resulting in obtaining a good resolution of 100 μm/100 μm.

Example 4

A polymerization initiator A, i.e. Irgacure 907 and a polymerization initiator B, i.e. Kayacure DETX-S were used in place of the polymerization initiator, CGI-284 and the photosensitizer NKX-1595 in Example 1 to obtain a photocurable composition of Example 4.

| | |
|---|---|
| Photopolymerizable polyurethane compound A | 100 parts |
| Polymerization initiator A (****) | 10 parts |
| Polymerization initiator B (*****) | 2 parts |
| Ethyl acetate | 400 parts |

The above formulation was mixed to-prepare a photopolymerizable composition of Example 4.

(****) Polymerization initiator A: aminoalkylphenone based photoradical polymerization initiator, trade name, Irgacure 907, marketed by Ciba Geigy Limited.

(*****) Polymerization initiator B: thioxanthone based photoradical polymerization initiator, trade name, Kayacure DETX-S, marketed by Nippon Kayaku Co., Ltd.

The photopolymerizable composition obtained as above was coated by a bar coater onto a copper-clad glass fiber-reinforced epoxy resin base having a copper layer of 18 μm on its surface, a base thickness of 2 mm and a size of 350×460 mm, followed by drying at 60° C. for 10 minutes to obtain a photocurable resist film having a dry film thickness of 10 μm, A light was irradiated onto the photocurable resist film-formed epoxy resin base so as to result a resolution of 100 μm/100 μm [line (μm)/space (μm)] in an irradiation dose of 100 mj/cm$^2$ by use of an ultrahigh pressure mercury lamp, followed by heating the photocurable resist-formed epoxy resin base at 60° C. for 10 minutes, dipping into a 1% sodium carbonate aqueous solution at 30° C. for one minute to carry out an alkali developing treatment for removing the non-cured area of the photocurable resist film, resulting in forming a resist pattern having a good resolution of 100 μm/100 μm, carrying out etching by dipping into an aqueous 24% ferric chloride solution for 2 minutes to remove an exposed copper layer, resulting in obtaining a good resolution of 100 μm/100 μm.

Example 5

In place of the photocurable resist composition of Example 2, a color pigment, extender pigment, curing agent, etc. were added to obtain a photocurable solder resist composition of Example 5.

| | |
|---|---|
| Photopolymerizable polyurethane compound A | 100 parts |
| Polymerization initiator A (****) | 5 parts |
| Polymerization initiator B (*****) | 1 part |
| Phthalocyanine green | 1 part |
| Talc | 50 parts |
| Epoxy resin (******) | 20 parts |
| Ethyl acetate | 100 parts |

The above formulation was dispersed and mixed to prepare a photopolymerizable composition of Example 5.

(****) Polymerization initiator A: aminoalkylphenone based photoradical polymerization initiator, trade name, Irgacure 907, marketed by Ciba Geigy Limited.

(*****) Polymerization initiator B: thioxanthone based photoradical polymerization initiator, trade name, Kayacure DETX-S, marketed by Nippon Kayaku Co., Ltd.

(******) Epoxy resin: bisphenol A type liquid epoxy resin, trade name, Epikote 828, marketed by Yuka Shell Co., Ltd.

The photopolymerizable composition obtained as above was coated by a bar coater onto a copper-clad glass fiber-reinforced epoxy resin base having a copper layer of 18 μm on its surface, a base thickness of 2 mm and a size of 350×460 mm, followed by drying at 80° C. for 10 minutes to obtain a photocurable resist film having a dry film thickness of 50 μm.

A light was irradiated onto the photocurable resist film-formed epoxy resin base so as to result a resolution of 100

μm/100 μm [line (μm)/space (μm)] in an irradiation dose of 100 mj/cm² by use of an ultrahigh pressure mercury lamp, followed by dipping into a 1% sodium carbonate aqueous solution at 30° C. for one minute to carry out an alkali developing treatment for removing the non-cured area of the photocurable resist film, resulting in forming a resist pattern having a good resolution of 100 μm/100 μm.

Comparative Example 1

A mixture of 40 parts of methyl methacrylate, 40 parts of butyl acrylate, 20 parts of acrylic acid and 2 parts of azobisisobutyronitrile was dropped into 90 parts of propylene glycol monomethyl ether at 100° C. over 3 hours under nitrogen atmosphere. Completion of dropping was followed by aging for one hour, dropping a mixture of one part of azobisdimethylvaleronitrile and 10 parts of propylene glycol monomethyl ether over one hour, aging for 5 hours to obtain a high acid value acrylic resin (resin acid value: 155 mgKOH/g) solution, adding 24 parts of glycidyl methacrylate, 0.12 part of hydroquinone and 0.6 part of tetraethylammonium bromide, and reacting at 100° C. for 5 hours introducing air to obtain a photocurable resin solution having a solid content of about 55.4%. The resulting resin had a resin acid value of about 50 mgKOH/g and a number average molecular weight of about 20,000.

Example 1 was duplicated except that the above photocurable resin solution was used in place of the photopolymerizable polyurethane compound A in Example 1 in the same amount as the compound A as the solid content to obtain a photocurable composition of Comparative Example 1.

The above photocurable composition was subjected to the same procedures as in Example 1 to obtain a photocurable resist film on the epoxy resin base.

A visible light laser was irradiated onto the photocurable resist film-formed epoxy resin base so as to result a resolution of 100 μm/100 μm [line (μm)/space (μm)] in an irradiation dose of 3 mj/cm² by use of a 488 nm wave length argon ion laser irradiation apparatus, followed by heating the photocurable resist-formed epoxy resin base at 60° C. for 10 minutes, dipping into a 1% sodium carbonate aqueous solution at 30° C. for one minute to carry out an alkali developing treatment for removing the non-cured area of the photocurable resist film, carrying out etching by dipping into an aqueous 24% ferric chloride solution for 2 minutes, resulting in that separation of the resist film during etching made it impossible to obtain a resolution of 100 μm/100 μm.

Comparative Example 2

Example 1 was duplicated except that the following water-soluble photocurable resist composition was used in place of the photopolymerizable polyurethane compound A in Example 1 in the same amount as the compound A as the solid content to obtain a photocurable composition of Comparative Example 2.

The water-soluble photocurable resist composition was prepared by a process which comprises charging a mixture of 334 parts of polyesterdiol (polymethylpentane adipate, marketed by Kuraray Co., Ltd., number average molecular weight: 2000), 24.3 parts of glycerol monoacrylate, 44.7 parts of 2,2-dimethylol propionic acid, 0.52 part of hydroquinone monomethyl ether, and 0.26 part of dibutyltin dilaurate, heating at 40° C. adding 185 parts of isophorone diisocyanate with agitation introducing a dry air, heating at 80° C. for reacting for 6 hours to obtain an intermediate having an isocyanate group content of 1.30% by weight, adding 34.8 parts of 2-hydroxyethyl acrylate, reacting at 80° C. for 15 hours to obtain an urethane resin containing a radically polymerizable unsaturated group having an isocyanate group content of 0.16% by weight and an anionic, hydrophilic group, cooling down to 40° C., adding 33.7 parts of triethylamine, uniformly mixing with agitation to form a resin solution, introducing the resin solution into a five liter four-necked flask charged with 1503 parts of deionized water at 50° to make water-soluble, and subjecting to desolvating of methyl ethyl ketone under vacuum to obtain a light yellow, transparent, water-soluble, photocurable resin solution having a nonvolatile content of 30% by weight.

The water-soluble photocurable resist composition obtained as above was subjected to the same procedures as in Example 1 to obtain a photocurable resist film.

A visible light laser was irradiated onto the photocurable resist film-formed epoxy resin base so as to result a resolution of 100 μm/100 μm [line (μm)/space (μm)] in an irradiation dose of 3 mj/cm² by use of a 488 nm wave length argon ion laser irradiation apparatus, followed by heating the photocurable resist-formed epoxy resin base at 60° C. for 10 minutes, and dipping into a 1% sodium carbonate aqueous solution at 30° C. for one minute to carry out an alkali developing treatment for removing the non-cured area of the photocurable resist film, without obtaining a satisfactorily cured resist film.

Comparative Example 3

Example 1 was duplicated except that the following photocurable resin solution was used in place of the photopolymerizable polyurethane compound A in Example 1 in the same amount as the compound A as the solid content to obtain a photocurable composition of Comparative Example 3.

The photocurable resin was prepared by a process which comprises heating a mixture of 134 parts of dimethylol propionic acid, 366 parts of ε-caprolactone and 0.15 part of stannous chloride, reacting for about 10 hours, cooling down to 60° C., adding 333.4 parts of isophorone diisocyanate and, as a diluent, 409.4 parts of polyethylene glycol diacrylate (marketed by Nippon Kayaku Co., Ltd., Kayarad PEG400DA, trade name), reacting at 80° C. for about 10 hours, adding 121.8 parts of 2-hydroxyethyl acrylate and 0.6 part of p-methoxyphenol, and reacting at 80° C. for about 15 hours to obtain an urethane acrylate containing 30% of polyethylene glycol diacrylate.

The above photocurable composition was subjected to the same procedures as in Example 1 to obtain a photocurable resist film.

A visible light laser was irradiated onto the photocurable resist film-formed epoxy resin base so as to result a resolution of 100 μm/100 μm [line (μm)/space (μm)] in an irradiation dose of 5 mj/cm² by use of a 488 nm wave length argon ion laser irradiation apparatus, followed by heating the photocurable resist-formed epoxy resin base at 600° C. for 10 minutes, and dipping into a 1% sodium carbonate aqueous solution at 30° C. for one minute to carry out an alkali developing treatment for removing the non-cured area of the photocurable resist film, without obtaining a satisfactorily cured resist film.

Comparative Example 4

A mixture of 40 parts of methyl methacrylate, 40 parts of butyl acrylate, 20 parts of acrylic acid and 2 parts of azobisisobutyronitrile was dropped into 90 parts of propylene glycol monomethyl ether at 110° C. over 3 hours under nitrogen atmosphere. Completion of dropping was followed by aging for one hour, dropping a mixture of one part of azobisdimethylvaleronitrile and 10 parts of propylene glycol monomethyl ether over one hour, aging for 5 hours to obtain a high acid value acrylic resin (resin acid value: 155 mgKOH/g) solution, adding 24 parts of glycidyl methacrylate, 0.12 part of hydroquinone and 0.6 part of tetraethylammonium bromide, and reacting at 110° C. for 5 hours intorducing air to obtain a photocurable resin solution having a solid content of about 55.4%. The resulting resin had a resin acid value of about 50 mgKOH/g and a number average molecular weight of about 20,000.

Example 3 was duplicated except that the above photocurable resin solution was used in place of the photopolymerizable polyurethane compound A in Example 3 in the same amount as the compound A as the solid content to obtain a photocurable composition of Comparative Example 4.

The above photocurable resist composition was subjected to the same procedures as in Example 3 to obtain a photocurable solder resist film.

The photocurable composition obtained as above was coated by a bar coater onto a copper-clad glass fiber-reinforced epoxy resin base having a copper layer of 18 μm on its surface, a base thickness of 2 mm and a size of 350×460 mm, followed by drying at 80° C. for 10 minutes to obtain a photocurable resist film having a dry film thickness of 50 μm.

A light was irradiated onto the photocurable resist film-formed epoxy resin base so as to result a resolution of 100 μm/100 μm [line (μm)/space (μm)] in an irradiation dose of 100 mj/cm² by use of an ultrahigh pressure mercury lamp, followed by dipping into a 1% sodium carbonate aqueous solution at 30° C. for one minute to carry out an alkali developing treatment for removing the non-cured area of the photocurable resist film, resulting in producing a remaining photocurable resist film without being removed, and in making it impossible to obtain a resist pattern having a resolution of 100 μm/100 μm.

Effect of the Invention

Thus, the present invention provides such remarkable effects (1) that a narrow molecular weight distribution provides a uniform solubility in an alkali developing solution and good anti-etching resistance to the etching solution, (2) that ensured introduction of carboxyl group into the resin provides a uniform solubility in the alkali developing solution and good anti-etching resistance to the etching solution, (3) that presence of polyurethane linkage provides good coating film properties and good anti-etching resistance, and that (4) the absence of the basic compound such as an amine and the like as the neutralizing agent in the molecule results good properties in anti-alkali developing properties and anti-etching properties in the exposed area.

Applicability in the field

The organic solvent based photocurable resist composition of the present invention is applicable to a solder resist, etching resist, anti-plating resist, etc.

What is claimed is:

1. An organic solvent based photocurable resist composition containing a photopolymerizable polyurethane compound having a repeating unit represented by the following formula: B—[X]$_n$[Y]$_m$—B, where X is represented by the formula:

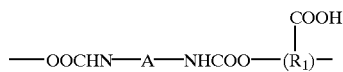

and Y is represented by the formula:
—OOCHN—A—NHCOO—(R$_2$)—, A is a structural unit derived from a polyisocyanate compound, B is same or different and a structural unit derived from a hydroxy compound having at least one photopolymerizable unsaturated group at molecular terminals respectively, R$_1$ is a structural unit derived from dimethylol butyric acid, R$_2$ is a structural unit derived from a polyol compound, n is an integer of 1 to 10, m is an integer of 1 to 10, provided that at least one X and at least one Y are optionally bonded to each other so as to form at least one X-Y bond, said composition being dissolved or dispersed into an organic solvent, in use.

2. A method of forming a resist pattern comprising the following steps: (1) coating the organic solvent based photocurable resist composition as claimed in claim 1 onto a substrate to form a photocurable resist film, (2) exposing the photocurable resist film directly to a visible light laser beam for curing so that a resist film having a predetermined printed image can be formed; and (3) subjecting the resist film formed in the step (2) to an alkali developing treatment to form a resist pattern on the substrate.

3. A composition as claimed in claim 1, wherein B is a structural unit derived from a hydroxy compound having two photopolymerizable unsaturated groups at molecular terminals respectively.

4. A composition as claimed in claim 1, wherein said composition contains a titanocene compound as a polymerization initiator.

5. A composition as claimed in claim 1, wherein said composition contains a photosensitizer.

6. A composition as claimed in claim 3, wherein said composition contains a titanocene compound as a polymerization initiator.

7. A composition as claimed in claim 3, wherein said composition contains a photosensitizer.

* * * * *